(12) United States Patent
Endo (10) Patent No.: US 12,332,328 B2
(45) Date of Patent: Jun. 17, 2025

(54) ANGLE ADJUSTER FOR NMR

(71) Applicant: JEOL Ltd., Tokyo (JP)

(72) Inventor: Yuki Endo, Tokyo (JP)

(73) Assignee: JEOL Ltd., Tokyo (JP)

( * ) Notice: Subject to any disclaimer, the term of this patent is extended or adjusted under 35 U.S.C. 154(b) by 316 days.

(21) Appl. No.: 17/984,650

(22) Filed: Nov. 10, 2022

(65) Prior Publication Data

US 2023/0145398 A1 May 11, 2023

(30) Foreign Application Priority Data

Nov. 11, 2021 (JP) ................................. 2021-184360

(51) Int. Cl.
*G01R 33/30* (2006.01)
*G01R 33/483* (2006.01)

(52) U.S. Cl.
CPC ....... *G01R 33/307* (2013.01); *G01R 33/4831* (2013.01)

(58) Field of Classification Search
CPC .. G01R 33/307; G01R 33/4831; G01R 33/30; G01R 33/44; Y02A 90/30
See application file for complete search history.

(56) References Cited

U.S. PATENT DOCUMENTS

| | | | |
|---|---|---|---|
| 4,996,483 A | 2/1991 | Beer et al. | |
| 5,424,644 A * | 6/1995 | Zeiger | G01R 33/343 |
| | | | 324/318 |
| 5,760,586 A * | 6/1998 | Foerster | G01R 33/307 |
| | | | 324/318 |
| 2010/0097060 A1* | 4/2010 | Johannessen | G01D 5/145 |
| | | | 324/322 |
| 2011/0018536 A1 | 1/2011 | Mullen | |
| 2017/0248404 A1 | 8/2017 | Freytag | |

FOREIGN PATENT DOCUMENTS

| JP | S5412304 U | 1/1979 |
|---|---|---|
| JP | 2000123499 A | 4/2000 |
| JP | 20016302 A | 1/2001 |
| JP | 200569802 A | 3/2005 |

(Continued)

OTHER PUBLICATIONS

English translation of JP2009-236512A provided by Espacenet. 2024 (Year: 2024).*

(Continued)

*Primary Examiner* — Rishi R Patel
(74) *Attorney, Agent, or Firm* — The Webb Law Firm (57) ABSTRACT

An angle adjuster for nuclear magnetic resonance (NMR) includes a linear motion member composed of a shaft and a support member, a rotary member, a conversion mechanism, and a spring. The linear motion member is a member that serves to change, in an NMR probe device, an angle of a sample tube by a linear motion. The rotary member is rotated by a motor. The conversion mechanism converts a rotary motion of the rotary member into a linear motion of the linear motion member. The spring provides, at a portion where the linear motion member and the rotary member are in engagement with each other, a force that urges the linear motion member in one direction toward the rotary member.

7 Claims, 8 Drawing Sheets

(56) References Cited

FOREIGN PATENT DOCUMENTS

| JP | 2006149488 A | 6/2006 |
| JP | 200992424 A | 4/2009 |
| JP | 2009236512 A | 10/2009 |
| JP | 5117903 B2 | 10/2012 |
| JP | 2014198061 A | 10/2014 |

OTHER PUBLICATIONS

Extended European Search Report issued in EP22206172.3 on Mar. 16, 2023.
Schneider et al., A Variable-Temperature Probe for the Measurement of 1H NMR Spectra with Magic-Angle Rotation, Journal of Magnetic Resonance, vol. 37, 1980, pp. 41-47.
Mai et al., Simple Cylindrical Magic-Angle Spinner for NMR Studies in Electromagnets, Journal of Magnetic Resonance, vol. 56, 1984, pp. 131-139.
Office Action issued in JP2021184360 on Dec. 19, 2023.

\* cited by examiner

FIG. 11

ANGLE ADJUSTER FOR NMR

CROSS REFERENCE TO RELATED APPLICATION

This application claims priority to Japanese Patent Application No. 2021-184360 filed Nov. 11, 2021, the disclosure of which is hereby incorporated by reference in its entirety.

BACKGROUND OF THE DISCLOSURE

Field of the Disclosure

The present disclosure relates to a technique of adjusting the angle of a sample tube placed inside an NMR probe device used for nuclear magnetic resonance (NMR) measurement.

Description of Related Art

A nuclear magnetic resonance (NMR) apparatus is an apparatus which applies a static magnetic field to atomic nuclei having spin magnetic moments so as to induce Larmor precession of the spin magnetic moments, irradiates thereto radiofrequency waves having the same frequency as the precession so as to cause resonance, and thereby detects signals from the atomic nuclei having the spin magnetic moments.

In NMR measurements performed with respect to solid samples, the MAS (magic angle spinning) method is typically employed. In the MAS method, a sample tube containing a solid sample is spun at a high speed while being tilted at the magic angle (of approximately 54.7 degrees) relative to the direction of the static magnetic field, and an NMR signal is detected in that state.

An NMR probe device for implementing the MAS method is used for NMR measurements by being inserted into a measurement space having the form of an elongate cavity provided in a magnetic field generator, a typical example of which is a superconducting magnet. In a MAS probe device, a sample tube containing a solid sample is placed in a sample tube support device in a state of being tilted at the magic angle relative to the magnetic field.

The sample tube, a detection coil, and the like are held in a MAS module, and the angle of this MAS module is adjusted to the magic angle by an angle adjustment mechanism. Conventional angle adjustment mechanisms are mechanisms which include a screw and a coupling, and which serve to convert rotation of the screw into tilt of the MAS module. An operator rotates the screw to thereby tilt the MAS module and adjust the angle of the MAS module to the magic angle.

JP 5117903 B discloses a sample tube for holding therein an unknown sample, which is the measurement target, and a standard sample used for magic angle adjustment. The space within the sample tube is divided by a partition wall, and the unknown sample and the standard sample are respectively held in separate spaces.

JP 2009-92424 A discloses a device in which signals derived from a sample by applying NMR pulses are stored together with corresponding tilt angles of the sample, and from the stored data, a tilt angle at which the maximum signal is obtained is extracted.

JP 2001-6302 A describes a configuration in which an elastic member is used to urge a gear against another gear.

Since conventional angle adjustment mechanisms are operated manually, there are difficulties in precisely adjusting the angle of a sample tube inside an NMR probe device.

The present disclosure is directed to precisely adjusting the angle of a sample tube inside an NMR probe device.

SUMMARY OF THE DISCLOSURE

According to one aspect of the present disclosure, an angle adjuster for NMR includes: a linear motion member configured to change, in an NMR probe device, an angle of a sample tube by a linear motion; a conversion mechanism configured to convert a rotary motion of a rotary member rotated by a drive device into a linear motion of the linear motion member; and a first elastic member which, at a portion where the linear motion member and the rotary member are in engagement with each other, provides a force that urges the linear motion member in one direction toward the rotary member.

According to the above-described configuration, a force that urges the linear motion member in one direction toward the rotary member is provided at the portion where the linear motion member and the rotary member are in engagement with each other, so that mechanical clearance (i.e., backlash) between the rotary member and the linear motion member can be reduced. It is therefore possible to control, with high precision, the linear motion of the linear motion member by the rotary motion of the rotary member, and the angle of the sample tube can be adjusted with high precision.

The above-noted one direction may be a direction opposite to the direction in which the linear motion member is linearly moved in order to tilt the sample tube from a vertical state to a tilted state. For example, a spring is used as the first elastic member. The spring is placed at a position where the spring is compressed when the linear motion member is linearly moved in order to tilt the sample tube from a vertical state to a tilted state. When the spring is compressed, elastic force of the spring increases, so that the linear motion member can be urged with a greater force. As a result, backlash can be further reduced.

The angle adjuster for NMR may further include a support member, which is configured to linearly move together with the linear motion member, and at that time, support the linear motion member while being supported by a guide.

The angle adjuster for NMR may further include: a shaft connected to the drive device and the rotary member, and configured to be rotated by the drive device and to transmit rotation to the rotary member; an engaging member which causes the shaft and the rotary member to be engaged with each other; and a second elastic member which, at the engaging member, urges the shaft against the engaging member.

The conversion mechanism and the drive device may be provided outside a device for forming a magnetic field for NMR measurement.

The angle adjuster for NMR may further include a control device configured to control the angle of the sample tube by controlling the rotary motion of the rotary member caused by the drive device. The control device may adjust the angle of the sample tube to a set angle by controlling the angle of the sample tube in such a manner that precision of a first control for linearly moving the linear motion member in order to rotate the sample tube from a vertical state to a tilted state is set higher than precision of a second control for linearly moving the linear motion member in order to rotate the sample tube from a tilted state to a vertical state.

The angle adjuster for NMR may further include: a control device configured to control the angle of the sample tube by controlling the rotary motion of the rotary member caused by the drive device; and a storage device configured to store a control value of the drive device used when an angle of a sample tube containing a standard sample was adjusted to a set angle by a rotary motion of the rotary member caused by the drive device. The control device may adjust an angle of a sample tube containing a measurement target sample to the set angle by controlling, according to the control value stored in the storage device, a rotary motion of the rotary member caused by the drive device.

According to the present disclosure, the angle of a sample tube can be precisely adjusted in an NMR probe device.

BRIEF DESCRIPTION OF THE DRAWINGS

Embodiment(s) of the present disclosure will be described based on the following figures, wherein.

DESCRIPTION OF NON-LIMITING
EMBODIMENTS OF THE DISCLOSURE

Figure 1:
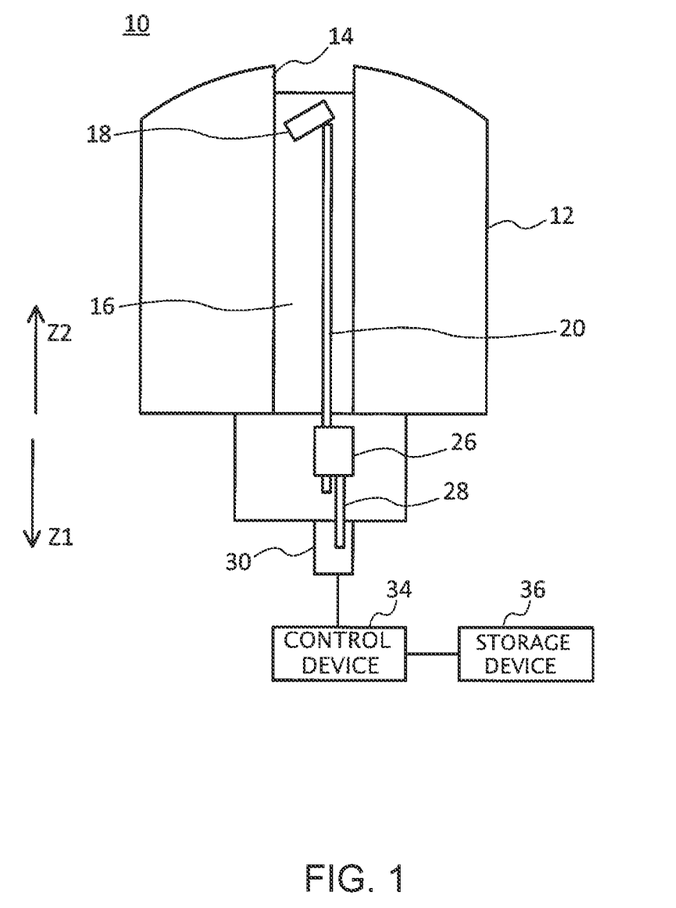
FIG. 1 is a diagram showing an NMR apparatus according to an embodiment.

FIG. 1 shows an example NMR apparatus according to an embodiment. The NMR apparatus 10 is an apparatus for measuring an NMR signal generated from observed nuclei in a sample.

A static magnetic field generator 12 is a device for generating a static magnetic field, and has, at its central part, a bore 14 in the form of a vertically-extending cavity. An NMR probe device 16 has a vertically-extending cylindrical shape as a whole, and is inserted into the bore 14 of the static magnetic field generator 12. The NMR probe device 16 is a device for implementing the MAS method. In the NMR probe device 16, a MAS module 18 is mounted. The MAS module 18 holds therein a sample tube and coils for transmission and for reception. The sample tube has, for example, a cylindrical shape, and contains a solid sample. The MAS module 18 is tilted at the magic angle relative to the static magnetic field. Accordingly, the sample tube held in the MAS module 18 is tilted at the magic angle relative to the static magnetic field. The sample tube is supported at its peripheral portion by a precision gas bearing on a spin axis tilted at the magic angle, and is spun at a high speed during measurement.

Figure 2:
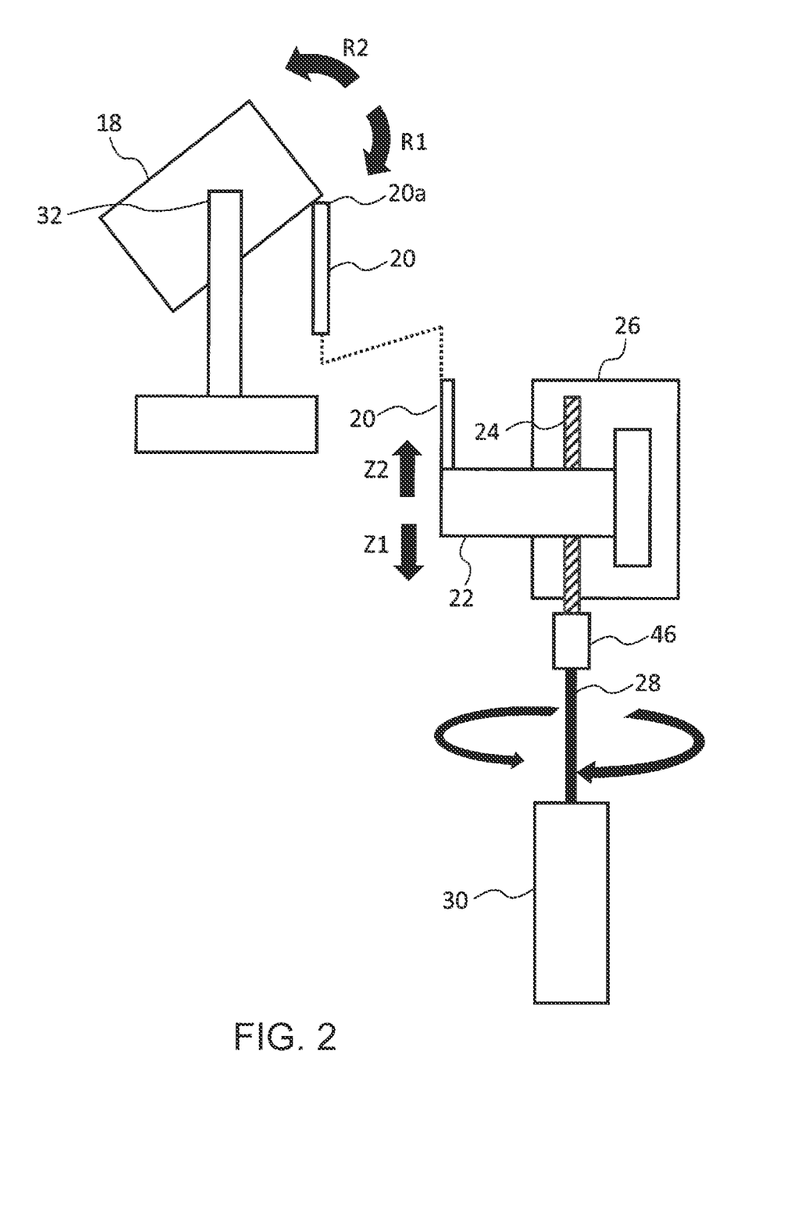
FIG. 2 is a diagram showing an angle adjuster for NMR according to an embodiment.
Figure 3:
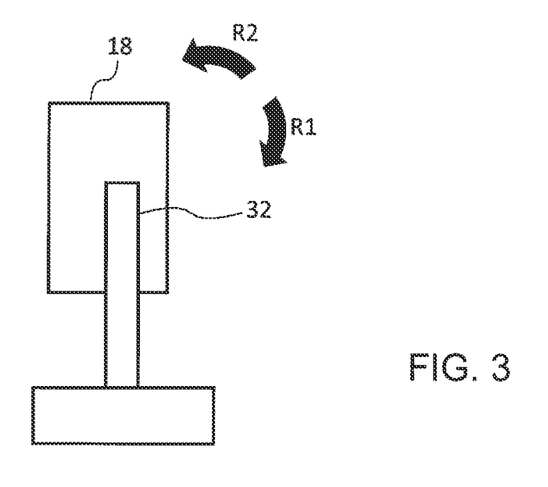
FIG. 3 is a diagram showing a MAS module.

FIGS. 1 to 3 illustrate the outline of the configuration of an angle adjuster for NMR. FIG. 2 is a diagram showing the angle adjuster for NMR. In FIG. 2, a part of a shaft 20 is not shown. FIG. 3 is a diagram showing the MAS module 18. The angle adjuster for NMR is a device for adjusting the angle of the MAS module 18, that is, the angle of the sample tube.

The angle adjuster for NMR includes a shaft 20, a support member 22, a rotary member 24, a conversion mechanism 26, a shaft 28, and a motor 30. The motor 30 is an example of a drive device.

The shaft 20 is a columnar member, which is supported by the support member 22 and which linearly moves downward Z1 or upward Z2 together with the support member 22. The shaft 20 and the support member 22 correspond to an example of a linear motion member.

The rotary member 24 is a cylindrical member. As will be described later, thread grooves are formed in the surface of the rotary member 24.

As shown in FIG. 2, the MAS module 18 is rotatably supported by a rotation shaft 32. One end 20a of the shaft 20 is in contact with an end portion of the MAS module 18 or a nearby portion thereof, and by linearly moving the shaft 20 and the support member 22, the MAS module 18 is caused to rotate, which results in a change in the tilt of the MAS module 18.

When the shaft 20 and the support member 22 are linearly moved downward Z1 in the NMR apparatus 10, the end portion of the MAS module 18 or a nearby portion thereof, with which the shaft 20 is in contact, is moved downward Z1 in the NMR apparatus 10, and as a result, the MAS module 18 is rotated from a vertical state to a tilted state. The direction of rotation from the vertical state to the tilted state is shown as rotation direction R1 in FIGS. 2 and 3. FIG. 2 shows the MAS module 18 in the tilted state. After the angle of the MAS module 18 is adjusted to the magic angle, a measurement is performed.

When the shaft 20 and the support member 22 are linearly moved upward Z2 in the NMR apparatus 10, the end portion of the MAS module 18 or a nearby portion thereof, with which the shaft 20 is in contact, is pushed upward Z2 from the downward Z1 position in the NMR apparatus 10, and as a result, the MAS module 18 is rotated from the tilted state to the vertical state. The direction of rotation from the tilted state to the vertical state is shown as rotation direction R2 in FIGS. 2 and 3. FIG. 3 shows the MAS module 18 in the vertical state. At the time of replacing a sample, the MAS module 18 is rotated to the vertical state. The sample tube that has been placed inside the MAS module 18 in the vertical state via an opening formed at an upper part of the bore 14 is taken out of the static magnetic field generator 12 from the opening formed at the upper part of the bore 14. Further, the sample tube is introduced into the bore 14 via the opening formed at the upper part of the bore 14, and is placed inside the MAS module 18.

The conversion mechanism 26 converts a rotary motion of the rotary member 24 rotated by the motor 30 into a linear motion of the shaft 20 and the support member 22. A rotary motion of the rotary member 24 is converted into a linear motion of the shaft 20 and the support member 22 according to the feed screw principle. The configuration of the support member 22 and the rotary member 24 will be described later in detail.

The shaft 28 is a columnar member connecting between the motor 30 and the rotary member 24. One end of the shaft 28 is connected to the motor 30, and the other end of the shaft 28 is connected to the rotary member 24. The motor 30 causes the shaft 28 to be rotated, which causes the rotary member 24 to be rotated. By means of the rotary motion of the rotary member 24, the shaft 20 and the support member 22 are linearly moved downward Z1 or upward Z2.

The shaft 20 and the support member 22 are linearly moved downward Z1 or upward Z2 according to the rotation direction of the motor 30, that is, the rotation direction of the rotary member 24 connected to the motor 30 via the shaft 28.

As the motor 30, for example, a stepping motor or an ultrasonic motor is used. Naturally, a motor other than these may also be used.

As shown in FIG. 1, the shaft 20 is provided inside the NMR probe device 16. The support member 22, the rotary member 24, the conversion mechanism 26, the shaft 28, and the motor 30 are provided outside the static magnetic field generator 12.

In cases where a motor that uses magnetic forces is employed as the motor 30, if the motor 30 is provided inside the static magnetic field generator 12, the motor 30 is undesirably affected by magnetic force from the static magnetic field generator 12. By providing the motor 30 outside the static magnetic field generator 12, the motor 30 can be operated at a location where there is little influence of magnetic force from the static magnetic field generator 12.

Further, in cases where a motor 30 unaffected by magnetic force such as an ultrasonic motor is used, if the motor 30 is provided inside the static magnetic field generator 12, the motor 30 may possibly become a source of noise. By providing the motor 30 outside the static magnetic field generator 12, it is possible to prevent the motor 30 from being a source of noise.

Further, by providing the support member 22, the rotary member 24, the conversion mechanism 26, the shaft 28, and the motor 30 outside the static magnetic field generator 12, there is no need to reserve a space for providing these elements inside the NMR probe device 16.

As shown in FIG. 1, the NMR apparatus 10 additionally includes a control device 34 and a storage device 36.

The control device 34 controls the operation of the motor 30 and thereby controls the rotary motion of the rotary member 24 rotated by the motor 30. By controlling the rotary motion of the rotary member 24, the linear motion of the shaft 20 and the support member 22 is controlled, and as a result, the angle of the MAS module 18, i.e., the angle of the sample tube, is adjusted. The control device 34 is, for example, a computer.

Functions of the control device 34 are implemented, for example, by cooperation of hardware and software. For example, the functions of the control device 34 are implemented by a processor such as a CPU (central processing unit) by reading out and executing a program stored in a memory of the control device 34. The program is stored into the memory via a recording medium such as a CD or a DVD, or via a communication path such as a network. Functions of respective sections of the control device 34 may be implemented by an ASIC (application-specific integrated circuit), an FPGA (field-programmable gate array), or other programmable logic devices, or may be implemented by hardware such as electronic circuits.

The storage device 36 is a device constituting a storage area for storing data, and is, for example, a memory (such as a RAM, a DRAM, or a ROM), a hard disk drive, a solid-state drive (SSD), an optical disk, or the like. The storage device 36 stores a control value of the motor 30. The control value is, for example, a value of an encoder of the motor 30.

Figure 4:
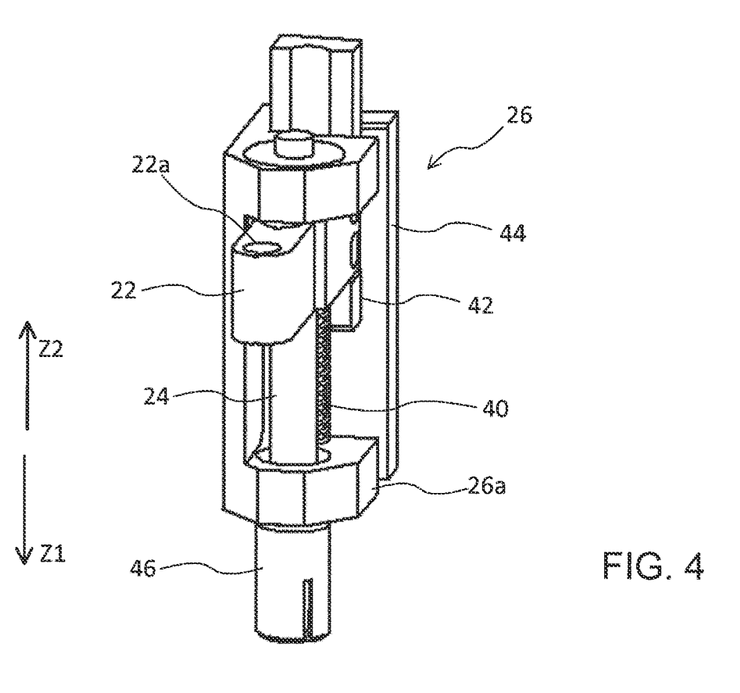
FIG. 4 is a perspective view showing a conversion mechanism and its surrounding configuration.
Figure 5:
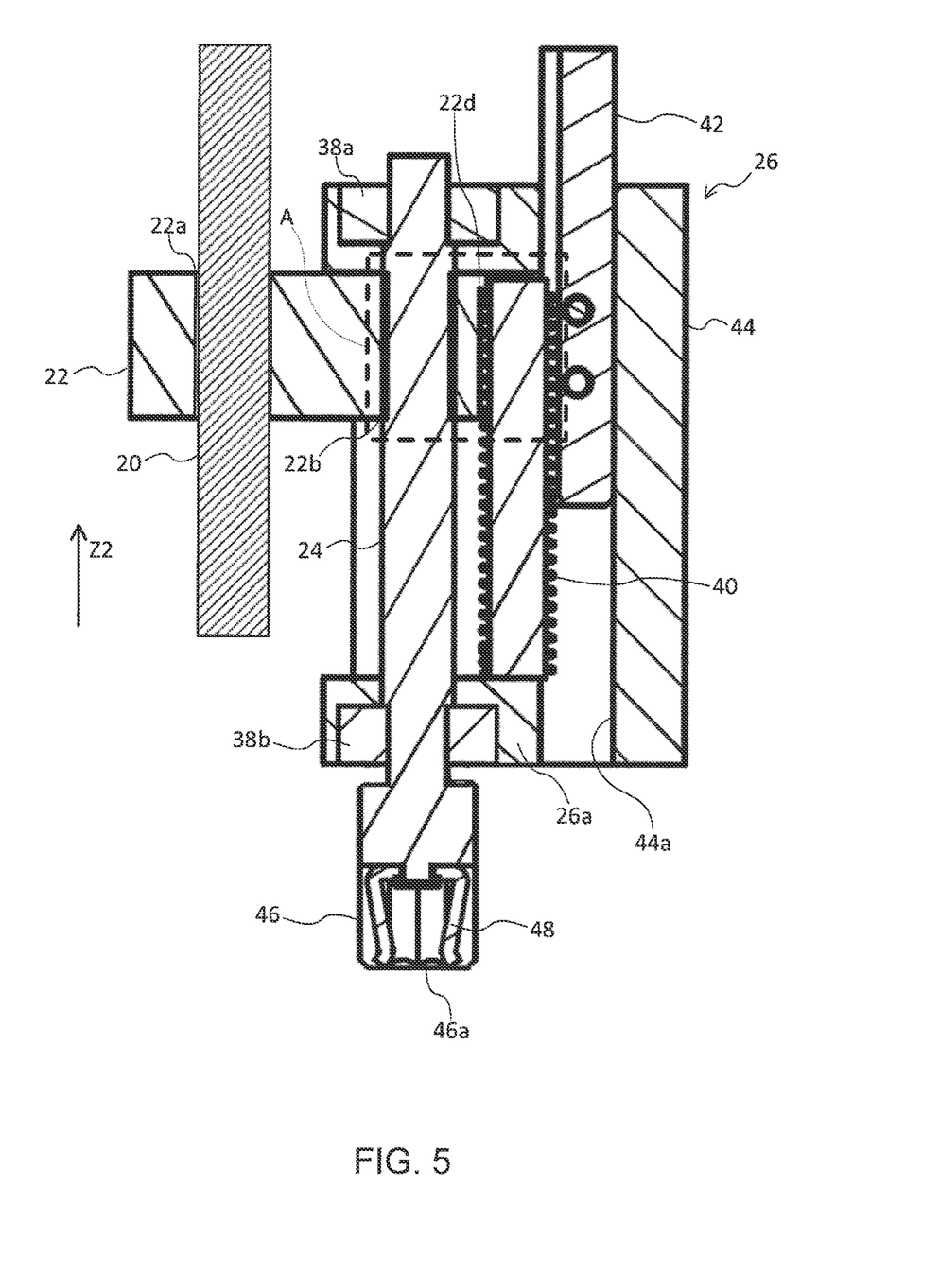
FIG. 5 is a cross-sectional view showing a conversion mechanism and its surrounding configuration.
Figure 6:
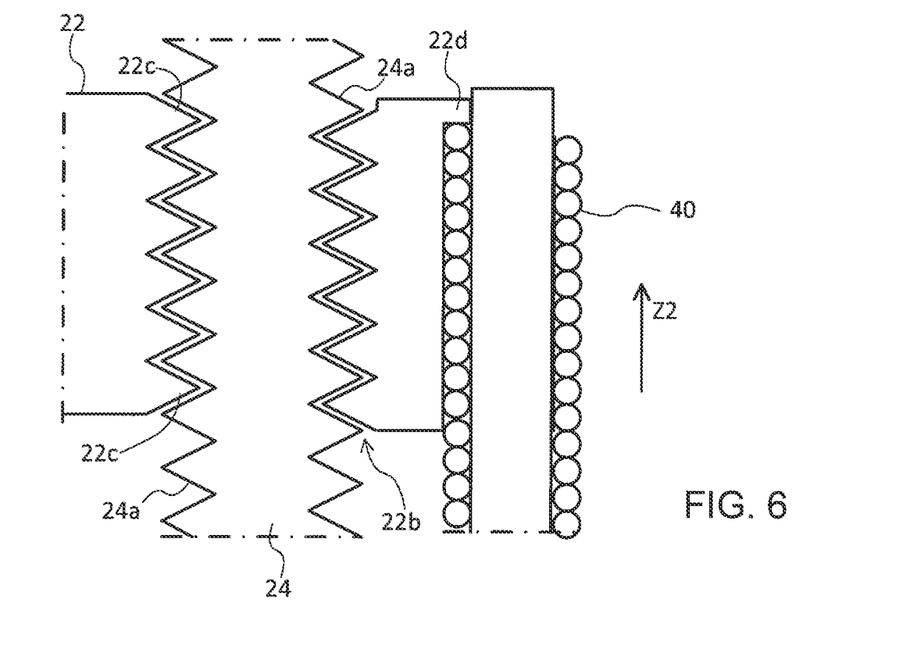
FIG. 6 is a cross-sectional view showing a support member and a rotary member.
Figure 7:
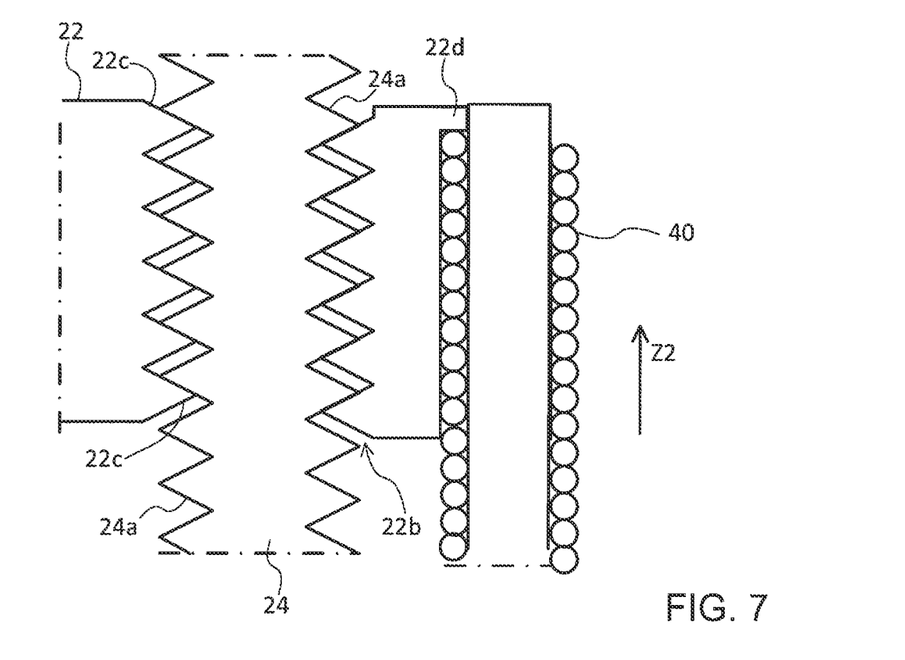
FIG. 7 is a cross-sectional view showing a support member and a rotary member.

The angle adjuster for NMR will now be described in detail by reference to FIGS. 4 to 7. FIG. 4 is a perspective view showing the conversion mechanism 26 and its surrounding configuration. FIG. 5 is a cross-sectional view showing the conversion mechanism 26 and its surrounding configuration. FIGS. 6 and 7 are cross-sectional views of the support member 22 and the rotary member 24, and show expanded views of the part indicated by reference sign A in FIG. 5.

As shown in FIGS. 4 and 5, the support member 22 has formed therein holes 22a and 22b penetrating through the support member 22 in the extending direction of the shaft 20. The shaft 20 is inserted into the hole 22a and supported by the support member 22.

The rotary member 24 is inserted into the hole 22b formed in the support member 22. As shown in FIGS. 6 and 7, thread grooves 22c are formed in the inner surface of the hole 22b (that is, in the surface of the passageway formed by the hole 22b), and thread grooves 24a are formed in the surface of the rotary member 24. When the rotary member 24 is inserted into the hole 22b, the thread grooves 22c in the inner surface of the hole 22b and the thread grooves 24a in the surface of the rotary member 24 mesh with each other. In this way, the support member 22, which constitutes a part of the linear motion member, and the rotary member 24 are engaged with each other. Here, the shape and pitch of the thread grooves 22c, 24a shown in FIGS. 6 and 7 are only schematically depicted as a matter of convenience for explaining the operations of the support member 22 and the rotary member 24. The actual shape and pitch are not limited to the shape and pitch shown.

A rotary motion of the rotary member 24 is converted into a linear motion of the shaft 20 and the support member 22 according to the feed screw principle. In other words, when the rotary member 24 is rotated, the support member 22 in engagement with the rotary member 24 by means of the thread grooves 22c, 24a is caused to linearly move downward Z1 or upward Z2. The shaft 20 supported by the support member 22 is also linearly moved downward Z1 or upward Z2 in accordance with the linear movement of the support member 22.

As shown in FIG. 5, the rotary member 24 is rotatably supported in the conversion mechanism 26 by bearings 38a and 38b.

In the conversion mechanism 26, a spring 40 is provided. The spring 40 is an example of a first elastic member, and, at the portions where the support member 22 constituting a part of the linear motion member and the rotary member 24 are in engagement with each other, provides a force that urges the support member 22 in one direction toward the rotary member 24. The spring 40 will now be described in detail.

The spring 40 is located along the extending direction of the columnar rotary member 24 (that is, along the vertical direction). As shown in FIGS. 4 and 5, one end of the spring 40 is in contact with a wall 26a provided at a lower part of the conversion mechanism 26.

As shown in FIGS. 5 to 7, a spring receiving portion 22d is formed on the support member 22. The spring receiving portion 22d is formed at a position facing the wall 26a across the spring 40. The other end of the spring 40 is in contact with this spring receiving portion 22d.

The spring 40 is located along the extending direction of the rotary member 24 by being sandwiched between the wall 26a and the spring receiving portion 22d. With this arrangement, the spring 40 provides, to the support member 22, a force that urges the support member 22 upward Z2. More specifically, as shown in FIGS. 6 and 7, at the portions where the support member 22 and the rotary member 24 are in engagement with each other, a force that urges the support member 22 upward Z2 is provided by the spring 40. As a result, the upper side surfaces of the thread grooves 22c of the support member 22 are placed into contact with the lower side surfaces of the thread grooves 24a of the rotary member 24. Here, the upward Z2 direction is an example of the one direction.

FIG. 6 shows a state before the elastic force of the spring 40 is made to act on the support member 22. FIG. 7 shows a state in which the elastic force of the spring 40 is acting on the support member 22. At a point before the elastic force of the spring 40 is made to act on the support member 22, a gap (i.e., backlash) occurs between the thread grooves 22c of the support member 22 and the thread grooves 24a of the rotary member 24. On the other hand, in a state in which the elastic force of the spring 40 is acting on the support member 22, the support member 22 is urged upward Z2, so that no gap (i.e., no backlash) occurs between the thread grooves 22c of the support member 22 and the thread grooves 24a of the rotary member 24, or the gap is reduced. In this way, by urging the support member 22 upward Z2 using the spring 40, occurrence of backlash between the thread grooves 22c and the thread grooves 24a can be suppressed. This makes it possible to suppress errors that may occur when a rotary motion of the rotary member 24 is converted into a linear motion of the linear motion member (i.e., the shaft 20 and the support member 22) in the conversion mechanism, and accordingly, the angle of the MAS module 18 can be controlled with high precision.

The upward Z2 direction, namely, the one direction, is a direction opposite to the direction (the downward Z1 direction) in which the linear motion member (i.e., the shaft 20 and the support member 22) is linearly moved in order to tilt the MAS module 18 from the vertical state to the tilted state. In other words, the one direction is the direction in which the linear motion member is linearly moved in order to rotate the MAS module 18 from the tilted state to the vertical state.

Further, as shown in FIGS. 4 and 5, a support member 42 is provided. The support member 42 is a member that linearly moves together with the linear motion member (i.e., the shaft 20 and the support member 22) while supporting the linear motion member. An end portion of the support member 22, which is located on a side opposite to the hole 22a across the hole 22b, is fixed to the support member 42. The support member 42 is a columnar member and is supported by a guide 44, which is provided on a side opposite to the support member 22 across the support member 42. The support member 42 linearly moves downward Z1 or upward Z2 while being in contact with a sliding surface 44a of the guide 44 and thereby being supported by the guide 44. Although the shaft 20 is supported by the support member 22, the shaft 20 is supported by the support member 22 in a cantilever manner. By using the support member 42 to support the support member 22 constituting the linear motion member, the shaft 20 can be linearly moved stably.

Figure 8:
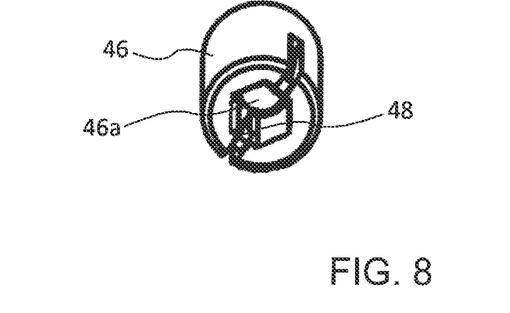
FIG. 8 is a perspective view showing an engaging member.
Figure 9:
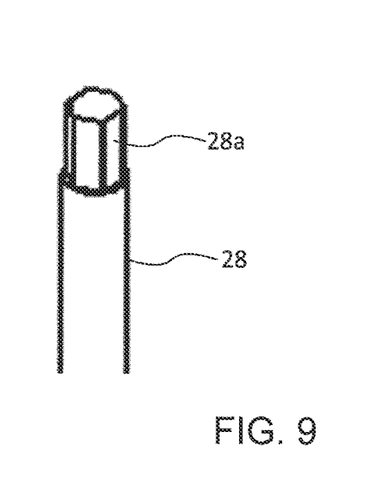
FIG. 9 is a perspective view showing a tip portion of a shaft.

Furthermore, an engaging member 46 is provided. The engaging member 46 and its surrounding configuration will now be described by reference to FIGS. 5, 8, and 9. FIG. 8 is a perspective view showing the engaging member 46. FIG. 9 is a perspective view showing an end portion of the shaft 28.

The engaging member 46 is a member which is fixed to a lower end portion of the rotary member 24 and which causes the rotary member 24 and the shaft 28 to be engaged with each other. A tip portion 28a of the shaft 28 has a polygonal shape. In the example shown in FIG. 9, the tip portion of the shaft 28 has a hexagonal shape. The engaging member 46 has a hole 46a formed therein. The hole 46a has a shape corresponding to the tip portion 28a of the shaft 28. In the example shown in FIG. 8, the hole 46a has a hexagonal shape. The tip portion 28a of the shaft 28 is inserted into the hole 46a of the engaging member 46, and the rotary member 24 and the shaft 28 are thereby connected via the engaging member 46. Rotation performed by the motor 30 is transmitted via the shaft 28 and the engaging member 46 to the rotary member 24, and the rotary member 24 is rotated.

A spring 48 is provided inside the hole 46a of the engaging member 46. The spring 48 is an example of a second elastic member, and is a member that urges the tip portion 28a of the shaft 28 against the engaging member 46 (more specifically, against a side surface of the hole 46a of the engaging member 46). Specifically, the spring 48 causes the tip portion 28a inserted in the hole 46a to be pushed against and placed into contact with one surface of the polygonal hole 46a. With this arrangement, a gap (i.e., backlash) is eliminated at the part where the tip portion 28a is in contact with the one surface of the hole 46a. As a result, it is possible to suppress occurrence of mechanical clearance at the time the shaft 28 is rotated.

Figure 10:
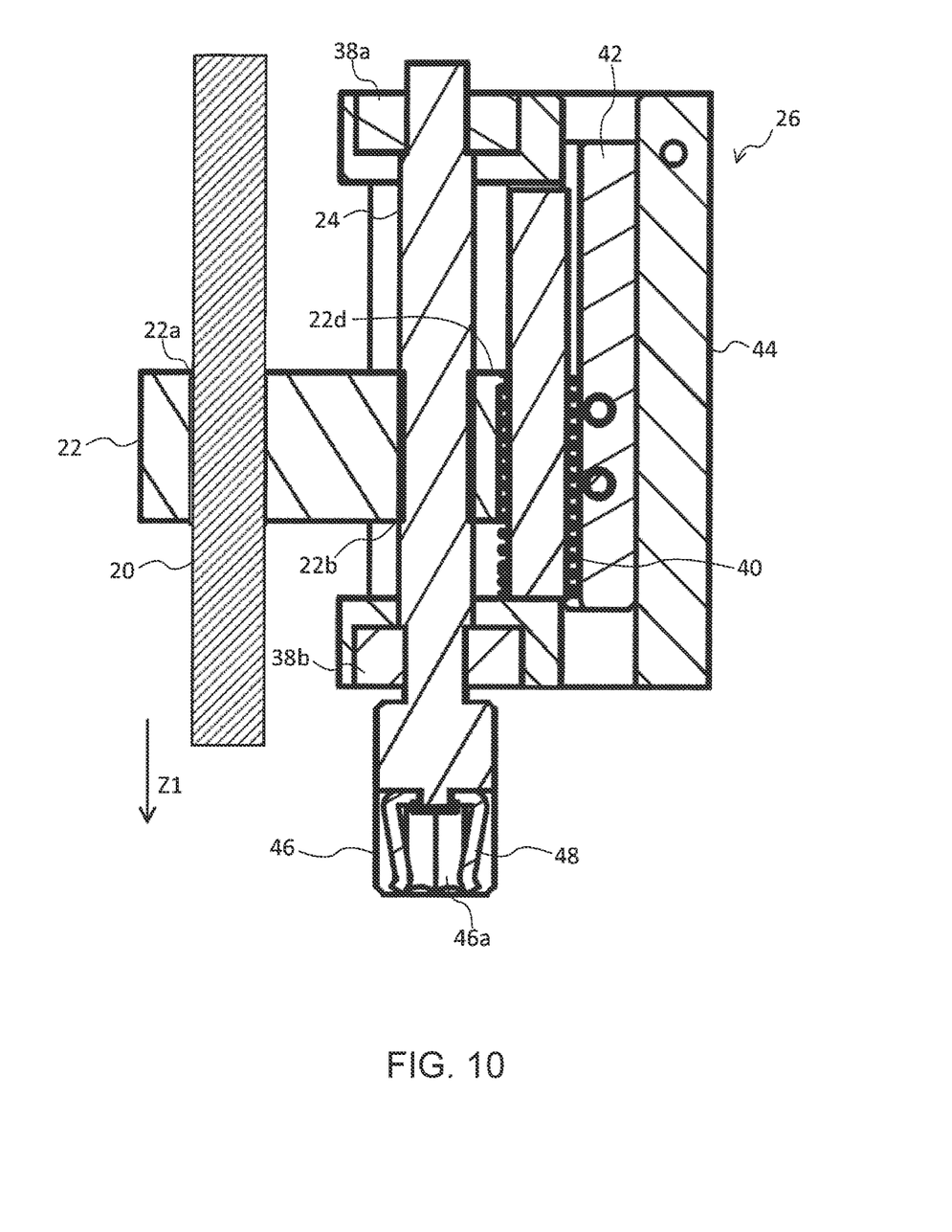
FIG. 10 is a cross-sectional view showing a conversion mechanism and its surrounding configuration.

Operations of the angle adjuster for NMR in adjusting the angle of the MAS module 18 will now be described by reference to FIGS. 2, 3, 5, and 10. FIG. 10 is a cross-sectional view showing the conversion mechanism 26 and its surrounding configuration.

The rotary member 24 is rotated by an operation of the motor 30, and this rotation is transmitted to the support member 22, as a result of which the support member 22 and the shaft 20 are linearly moved downward Z1 or upward Z2.

FIG. 5 illustrates a state in which the support member 22 and the shaft 20 have moved upward Z2. In this state, as shown in FIG. 3, the shaft 20 pushes upward Z2 the end portion of the MAS module 18 or a nearby portion thereof, with which the shaft 20 is in contact. This causes the MAS module 18 to be rotated from the tilted state to the vertical state. When the support member 22 is in the state of having moved upward Z2, the spring 40 is placed in an extended state.

FIG. 10 illustrates a state in which the support member 22 and the shaft 20 have moved downward Z1. In this state, as shown in FIG. 2, the MAS module 18 is rotated from the vertical state to the tilted state. When the support member 22 is in the state of having moved downward Z1, the spring 40 is placed in a compressed state.

When the support member 22 is in the state of having moved downward Z1, compared to when the support member 22 is in the state of having moved upward Z2, the spring 40 is more compressed, so that the force by which the spring 40 urges the spring receiving portion 22d is greater. In other words, in the operation of rotating the MAS module 18 from the vertical state to the tilted state, the force by which the spring 40 urges the spring receiving portion 22d becomes greater. Accordingly, the force by which the upper side surfaces of the thread grooves 22c of the support member 22 push against the lower side surfaces of the thread grooves 24a of the rotary member 24 becomes greater (see FIG. 7), so that occurrence of backlash can be further suppressed. As a result, the precision of the operation performed in linearly moving the linear motion member (i.e., the shaft 20 and the support member 22) in order to rotate the MAS module 18 from the vertical state to the tilted state becomes higher than the precision of the operation performed in linearly moving the linear motion member in order to rotate the MAS module 18 from the tilted state to the vertical state. In other words, occurrence of backlash can be further suppressed, and the angle of the MAS module 18 can be adjusted with higher precision.

Figure 11:
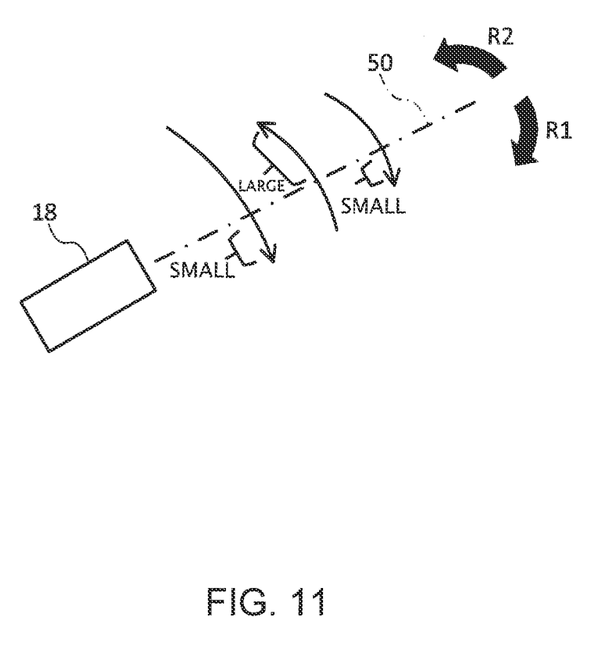
FIG. 11 is a diagram illustrating rotation of a MAS module.

The control device 34 may adjust the angle of the MAS module 18 to a set angle (e.g., the magic angle) while changing the precision of control between a first control for linearly moving the linear motion member in order to rotate the MAS module 18 from the vertical state to the tilted state, and a second control for linearly moving the linear motion member in order to rotate the MAS module 18 from the tilted state to the vertical state. Specifically, the control device 34 adjusts the angle of the MAS module 18 to the magic angle with the precision of the first control set higher than the precision of the second control. The first control and the second control will now be described by reference to FIG. 11. FIG. 11 is a diagram illustrating rotation of the MAS module 18.

For example, in the first control, compared to in the second control, the control device 34 may rotate the motor 30 at a lower speed to thereby reduce the rotation speed of the MAS module 18, or may rotate the motor 30 in smaller increments to thereby cause the MAS module 18 to be rotated in smaller increments. In other words, when rotating the MAS module 18 from the vertical state to the tilted state (that is, when rotating the MAS module 18 in the rotation direction R1), compared to when rotating the MAS module 18 from the tilted state to the vertical state (that is, when rotating the MAS module 18 in the rotation direction R2), the control device 34 reduces the rotation speed of the MAS module 18, causes the MAS module 18 to be rotated in smaller increments, and the like.

Reference sign 50 in FIG. 11 indicates the magic angle. For example, the MAS module 18 containing a standard sample is placed in the NMR probe device 16, and while the MAS module 18 is being rotated, an NMR signal from the standard sample is detected. The control device 34 causes the MAS module 18 to be rotated from the vertical state to the tilted state (i.e., performs the first control), and when the angle of the MAS module 18 exceeds the magic angle (e.g., when a peak is detected in the NMR signal), causes the MAS module 18 to be rotated in the rotation direction R2 (i.e., performs the second control). Further, when the angle of the MAS module 18 moves past the magic angle (e.g., when a peak is detected in the NMR signal), the control device 34 causes the MAS module 18 to be rotated in the rotation direction R1 (i.e., performs the first control). By repeating this operation, the control device 34 adjusts the angle of the MAS module 18 to the magic angle. For example, the control device 34 adjusts the angle of the MAS module 18 to the magic angle by gradually reducing the range by which the angle of the MAS module 18 is varied.

As shown in FIG. 11, in the first control and in the second control, the control device 34 may employ different ranges by which the angle of the MAS module 18 is varied. For example, in the first control, compared to in the second control, the control device 34 reduces the range by which the angle of the MAS module 18 is varied. At the time of rotation of the MAS module 18 in the rotation direction R1, the spring 40 is compressed, and backlash can be further suppressed. For this reason, when rotating the MAS module 18 in the rotation direction R1, compared to when rotating the MAS module 18 in the rotation direction R2, the MAS module 18 can be rotated while reducing the range by which the angle of the MAS module 18 is varied with high precision For example, when adjusting the angle of the MAS module 18 to the magic angle, a standard sample is used. The angle of the MAS module 18 containing the standard sample is adjusted to the magic angle, and the control value (e.g., the encoder value) of the motor 30 used at the time of this adjustment is stored in the storage device 36. This control value is the value corresponding to the magic angle. After the sample is changed from the standard sample to a measurement target sample, the control device 34 adjusts the angle of the MAS module 18 to the magic angle by operating the motor 30 according to the control value stored in the storage device 36 and controlling the rotary motion of the rotary member 24. This process will now be described in detail.

First, a sample tube containing a standard sample is placed inside the MAS module 18. The control device 34 operates the motor 30 to repeatedly perform the above-described first control and second control, and to thereby cause the MAS module 18 to be rotated in the rotation direction R1 or rotation direction R2. For example, the controls illustrated in FIG. 11 are performed. During this rotation, an NMR signal from the standard sample is detected. The angle of the MAS module 18 at which a peak is detected in the NMR signal is detected as the magic angle. This detection may be performed automatically by the control device 34, or may be performed manually by an operating person. The control value (e.g., the encoder value) of the motor 30 used when this angle is detected is stored in the storage device 36 as the control value corresponding to the magic angle.

Next, the MAS module 18 is rotated to the vertical state, and the sample contained in the MAS module 18 is changed from the standard sample to a measurement target sample. The sample tube containing the measurement target sample is placed inside the MAS module 18. The control device 34 operates the motor 30 according to the control value stored in the storage device 36, and thereby adjusts the angle of the MAS module 18 to the angle corresponding to that control value. As a result, the angle of the MAS module 18 containing the measurement target sample is adjusted to the magic angle.

According to the angle adjuster for NMR according to an embodiment, by urging the support member 22 in the one direction using the spring 40, backlash can be reduced, and as a result, the angle of the MAS module 18 can be adjusted with high precision. For example, by urging the support member 22 in the upward Z2 direction, which is the direction opposite to the downward Z1 direction in which the linear motion member is linearly moved in order to rotate the MAS module 18 from the vertical state to the tilted state, the elastic force of the spring 40 becomes greater as the linear motion member is linearly moved downward Z1, so that backlash is reduced more, and the angle of the MAS module 18 can be adjusted with higher precision.

Further, by urging the shaft 28 against the engaging member 46 using the spring 48, backlash between the shaft 28 and the engaging member 46 is reduced, so that the rotation of the rotary member 24 can be controlled with high precision.

For example, in a case where a stepping motor in which rotation can be controlled with a precision of $1/1000$ rotation is used as the motor 30, and the pitch of the thread grooves 22$c$ of the support member 22 and the thread grooves 24$a$ of the rotary member 24 is 0.5, the minimum rotation angle of the MAS module 18 of 0.002 degrees can be achieved. As such, the angle of the MAS module 18 can be adjusted with higher precision compared to when the angle of the MAS module 18 is adjusted manually by an operating person.

The invention claimed is:

1. An angle adjuster for nuclear magnetic resonance (NMR), comprising:
    a linear motion member configured to change, in an NMR probe device, an angle of a sample tube by a linear motion;
    a conversion mechanism configured to convert a rotary motion of a rotary member rotated by a drive device into the linear motion of the linear motion member; and
    a first elastic member located adjacent to and along an extending direction of the rotary member which, at a portion where the linear motion member and the rotary member are in engagement with each other, provides a force that urges the linear motion member in one direction toward the rotary member.

2. The angle adjuster for NMR according to claim 1, wherein
    the one direction is a direction opposite to a direction in which the linear motion member is linearly moved in order to tilt the sample tube from a vertical state to a tilted state.

3. The angle adjuster for NMR according to claim 1, further comprising
    a support member configured to linearly move together with the linear motion member, and at that time, support the linear motion member while the support member is supported by a guide.

4. The angle adjuster for NMR according to claim 1, further comprising:
    a shaft connected to the drive device and the rotary member, and configured to be rotated by the drive device and to transmit rotation to the rotary member;
    an engaging member which causes the shaft and the rotary member to be engaged with each other; and
    a second elastic member which, at the engaging member, urges the shaft against the engaging member.

5. The angle adjuster for NMR according to claim 1, wherein
    the conversion mechanism and the drive device are provided outside a device for forming a magnetic field for NMR measurement.

6. The angle adjuster for NMR according to claim 1, further comprising
    a control device configured to control the angle of the sample tube by controlling the rotary motion of the rotary member caused by the drive device, wherein
    the control device adjusts the angle of the sample tube to a set angle by controlling the angle of the sample tube in such a manner that precision of a first control for linearly moving the linear motion member in order to rotate the sample tube from a vertical state to a tilted state is set higher than precision of a second control for linearly moving the linear motion member in order to rotate the sample tube from a tilted state to a vertical state.

7. The angle adjuster for NMR according to claim 1, further comprising:
    a control device configured to control the angle of the sample tube by controlling the rotary motion of the rotary member caused by the drive device; and
    a storage device configured to store a control value of the drive device used when an angle of a sample tube containing a standard sample was adjusted to a set angle by a rotary motion of the rotary member caused by the drive device, wherein
    the control device adjusts an angle of a sample tube containing a measurement target sample to the set angle by controlling, according to the control value stored in the storage device, a rotary motion of the rotary member caused by the drive device.

* * * * *